United States Patent
Parks

(10) Patent No.: US 9,117,729 B2
(45) Date of Patent: *Aug. 25, 2015

(54) DEPLETED CHARGE-MULTIPLYING CCD IMAGE SENSOR

(71) Applicant: Semiconductor Components Industries, LLC, Phoenix, AZ (US)

(72) Inventor: Christopher Parks, Rochester, NY (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/231,839

(22) Filed: Apr. 1, 2014

(65) Prior Publication Data

US 2014/0231881 A1 Aug. 21, 2014

Related U.S. Application Data

(63) Continuation of application No. 13/623,316, filed on Sep. 20, 2012, now Pat. No. 8,847,285.

(60) Provisional application No. 61/539,123, filed on Sep. 26, 2011.

(51) Int. Cl.
H01L 27/148 (2006.01)
H01L 27/146 (2006.01)

(52) U.S. Cl.
CPC ...... *H01L 27/14831* (2013.01); *H01L 27/1463* (2013.01); *H01L 27/14689* (2013.01)

(58) Field of Classification Search
CPC ................. H01L 27/14863; H01L 27/14812; H01L 27/14887

USPC ........... 257/223, 224, 230, E21.151, E21.152
See application file for complete search history.

(56) References Cited

U.S. PATENT DOCUMENTS

| | | | |
|---|---|---|---|
| 4,679,212 | A | 7/1987 | Hynecek |
| 5,043,819 | A | 8/1991 | Cheon et al. |
| 5,250,824 | A | 10/1993 | Janesick |
| 5,337,340 | A | 8/1994 | Hynecek |
| 5,371,033 | A | 12/1994 | Lee et al. |
| 5,627,388 | A | 5/1997 | Shinji |
| 5,693,968 | A | 12/1997 | Cherry et al. |
| 5,923,061 | A | 7/1999 | Linnenbrink et al. |
| 5,965,910 | A | 10/1999 | Wood |
| 6,259,085 | B1 | 7/2001 | Holland |
| 6,278,142 | B1 | 8/2001 | Hynecek |
| 6,288,744 | B1 | 9/2001 | Takahashi et al. |
| 6,784,412 | B2 | 8/2004 | Hynecek |
| 6,862,333 | B2 | 3/2005 | Kashima et al. |
| 6,902,527 | B1 | 6/2005 | Doguchi et al. |
| 7,050,101 | B2 | 5/2006 | Wako et al. |
| 7,078,670 | B2 | 7/2006 | Atlas et al. |
| 7,139,023 | B2 | 11/2006 | Hynecek |
| 7,271,468 | B2 | 9/2007 | Holland |
| 7,352,840 | B1 | 4/2008 | Hagarkar et al. |

(Continued)

FOREIGN PATENT DOCUMENTS

| | | |
|---|---|---|
| EP | 1 289 020 A2 | 3/2003 |
| EP | 2 264 766 A1 | 12/2010 |

(Continued)

*Primary Examiner* — John C Ingham

(57) ABSTRACT

In various embodiments, a charge-coupled device includes channel stops laterally spaced away from the channel by fully depleted regions.

16 Claims, 6 Drawing Sheets

(56) References Cited

U.S. PATENT DOCUMENTS

| | | |
|---|---|---|
| 7,485,840 B2 | 2/2009 | Lazovsky |
| 7,521,737 B2 | 4/2009 | Augusto |
| 7,609,311 B2 | 10/2009 | Denvir |
| 7,619,201 B2 | 11/2009 | Hadfield |
| 7,692,707 B2 | 4/2010 | Kondo et al. |
| 7,701,494 B2 | 4/2010 | Shibasaki |
| 7,728,899 B2 | 6/2010 | Kondo et al. |
| 7,777,797 B2 | 8/2010 | Ota |
| 7,821,042 B2 | 10/2010 | Nakashima et al. |
| 7,847,845 B2 | 12/2010 | Parks |
| 8,017,917 B2 | 9/2011 | Meng |
| 8,188,563 B2 | 5/2012 | Finkelstein et al. |
| 8,319,867 B2 | 11/2012 | Mabuchi et al. |
| 8,513,761 B2 | 8/2013 | Roy et al. |
| 8,847,285 B2 * | 9/2014 | Parks ............... 257/223 |
| 2002/0094599 A1 | 7/2002 | Hynecek |
| 2003/0042510 A1 | 3/2003 | Banghart et al. |
| 2004/0257438 A1 | 12/2004 | Doguchi et al. |
| 2005/0029553 A1 | 2/2005 | Hynecek |
| 2005/0270389 A1 | 12/2005 | Wuori et al. |
| 2007/0146521 A1 | 6/2007 | Robbins |
| 2007/0222983 A1 | 9/2007 | Tomaney et al. |
| 2008/0265177 A1 | 10/2008 | Connally et al. |
| 2008/0303933 A1 | 12/2008 | Kondo et al. |
| 2008/0309808 A1 | 12/2008 | Kusuda et al. |
| 2009/0250728 A1 | 10/2009 | Mizuno et al. |
| 2010/0001178 A1 | 1/2010 | Koshiba |
| 2011/0079705 A1 | 4/2011 | Tomaney et al. |
| 2011/0186913 A1 | 8/2011 | Suzuki et al. |
| 2012/0147236 A1 | 6/2012 | Parks |

FOREIGN PATENT DOCUMENTS

| | | |
|---|---|---|
| GB | 2 413 007 A | 10/2005 |
| JP | 2011-082386 | 4/2011 |
| WO | 2010/087366 A1 | 8/2010 |
| WO | 2011/053485 A1 | 5/2011 |

* cited by examiner

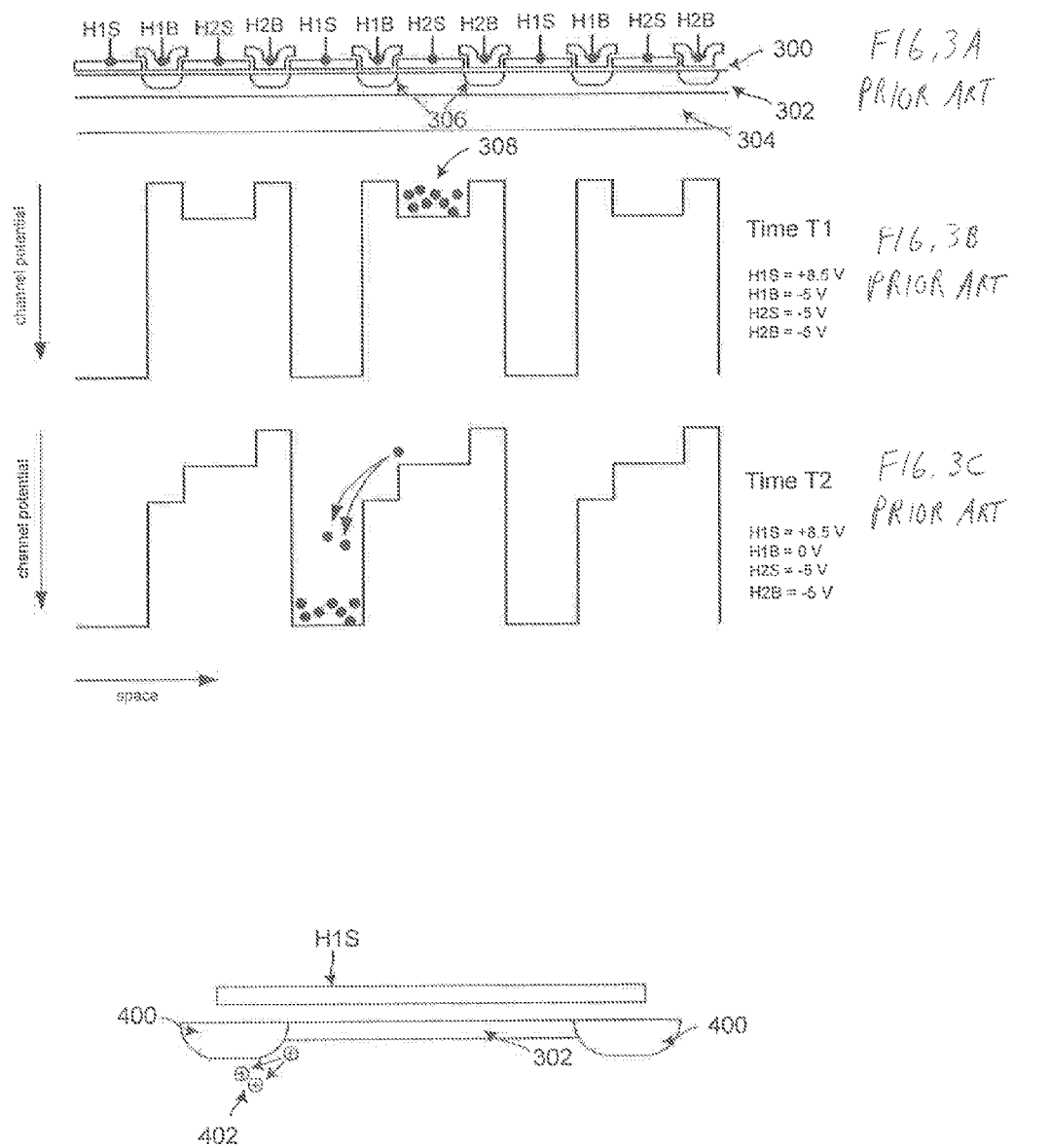

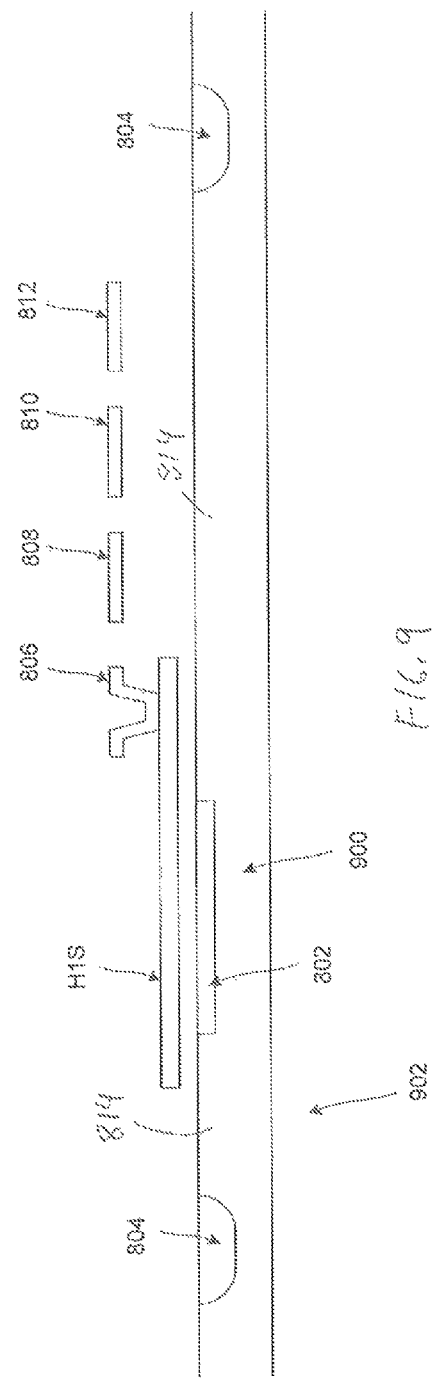

DEPLETED CHARGE-MULTIPLYING CCD IMAGE SENSOR

RELATED APPLICATION

This application is a continuation application of U.S. patent application Ser. No. 13/623,316, filed Sep. 20, 2012, which claims the benefit of and priority to U.S. Provisional Patent Application No. 61/539,123, filed Sep. 26, 2011, the entire disclosures of each of which are hereby incorporated by reference.

TECHNICAL FIELD

The present invention relates, in various embodiments, to the construction, fabrication, and use of charge-coupled-device (CCD) image sensors.

BACKGROUND

Charge-coupled device (CCD) image sensors typically include an array of photosensitive areas that collect charge carriers in response to illumination. The collected charge is subsequently transferred from the array of photosensitive areas and converted to a voltage from which an image may be reconstructed by associated circuitry. FIG. 1 depicts a conventional interline CCD image sensor 100 that contains an array of photosensitive areas 102 (each of which may include or consist essentially of a photodiode, photodetector, photocapacitor, or photoconductor) arranged in columns to form an imaging area 104. A vertical CCD (VCCD) 106 is disposed next to each column of photosensitive areas 102. As shown schematically in FIG. 1 (for only one column of photosensitive areas 102, for clarity), following an exposure period (during which charge packets 108 accumulate in the photosensitive areas 102), the charge packets 108 are transferred from the photosensitive areas 102 into respective shift-register elements 110 in the VCCDs 106, which subsequently shift the charge, row-by-row in parallel, into a horizontal CCD (HCCD) 112. The HCCD 112 then transfers the charge packets 108 serially to output circuitry 114, which may include, e.g., an output charge-sensing amplifier. The resulting data is then typically digitized, and the digitized image is displayed on a display or stored in a storage unit. As detailed below, the HCCD 112 may multiply charges therewithin by applying larger voltage levels to a portion of the transfer gate electrodes (not shown in FIG. 1) overlying the shift elements 116 in HCCD 112.

FIG. 2 is an expanded plan view along line A-A in FIG. 1. As shown, HCCD 112 is configured as a four-phase HCCD shift register, i.e., HCCD 112 features four transfer gate electrodes H1S, H1B, H2S, H2B overlying each shift element 116. FIG. 3A is a cross-sectional view along line B-B in FIG. 2 and FIGS. 3A-3C illustrate a charge-multiplying operation within HCCD 112. Transfer gate electrodes H1S, H1B, H2S, H2B are disposed over a thin gate dielectric 300. CCD charge-transfer channel 302 is typically an n-type buried channel in a p-type substrate 304. As shown in FIG. 3B, the charge-multiplying process begins at time T1 when transfer gate electrodes H1B, H2S, and H2B are held at low voltage levels and a large positive voltage level is applied to transfer gate electrode H1S. Threshold adjust barrier implants 306 formed under transfer gate electrodes H1B and H2B confine a charge packet 308 when transfer gate electrodes H1B, H2S, and H2B are all held at an equal low voltage. As shown in FIG. 3C, at a subsequent time T2, the voltage level on transfer gate electrode H1B is increased to allow charge to flow into the deep potential well under transfer gate electrode H1S. The deep potential well imparts a sufficient amount of energy to the electrons to liberate secondary electrons from the buried channel material through impact ionization, as described in U.S. Pat. No. 5,337,340, the entire disclosure of which is incorporated by reference herein. The impact ionization process multiplies (i.e., amplifies) the number of electrons in the original charge packet 308. The larger multiplied charge packet (or the signal corresponding thereto) is easier to detect than the original charge packet, enhancing performance of the image sensor.

FIG. 4 is a cross-sectional view along line C-C in FIG. 2 and illustrates the structure and location of p-type channel stop implants 400 (also depicted in FIG. 2) relative to transfer gate electrode H1S. Positively-charged holes 402 are pushed to the heavily doped channel stops 400 when a large voltage is applied to transfer gate electrode H1S. Just as electrons are multiplied by impact ionization, so are the holes 402. The multiplication of holes results in excess electrons left in CCD charge transfer channel 302 (also see FIG. 3). Spurious noise is generated when these excess electrons combine with a charge packet 308.

FIG. 5 is a cross-sectional view of one phase of another conventional charge-multiplying HCCD that utilizes additional gate electrodes to prevent spurious charge generation. As shown, additional gate electrodes 500 are utilized to shield the edges of a CCD channel transfer channel 502 from a high-voltage transfer gate electrode 504. Such designs are complex and expensive to manufacture because of the additional gate electrodes 500 and gate dielectrics 506 and 508 within the HCCD structure.

FIG. 6 is a top view of two shift elements of another conventional four-phase charge-multiplying HCCD, in which spurious charge generation is avoided by surrounding transfer gate electrodes 600 (to which a high voltage is applied) with low-voltage gates 602 and 604. The high-voltage gate 600 is thus separated from channel stops 606, and this spatial separation suppresses spurious charge generation. However, as with the structure of FIG. 5, the manufacturing process for fabricating gates 600, 602, 604 tends to be complex and expensive. Furthermore, the necessarily smaller area of gate 600 limits the amount of charge that may be held in the CCD. Thus, there is a need for designs for charge-multiplying HCCDs that are easily manufactured (i.e., that do not require utilization of additional or specially shaped gate electrodes) and that reduce or eliminate spurious charge generation due to impact ionization.

SUMMARY

Embodiments of the present invention greatly reduce or substantially eliminate spurious charge generation in a charge-multiplying CCD channel via impact ionization by spacing one or more oppositely doped (compared with the channel doping) channel stops away from the channel. (As known in the art, channel stops are regions, oppositely doped relative to the channel, that help define the lateral extent of the channel and/or prevent the formation of parasitic channels parallel to the channel.) The channel stops and the channel are preferably separated from each other by regions that are substantially fully depleted of charge carriers (i.e., electrons and/or holes). The channel stops are preferably not disposed beneath the CCD gate electrodes that control the flow of charge within the CCD. Such a configuration obviates the need for complicated schemes that implement additional gate electrodes for charge multiplication, thus enabling easier and less expensive manufacturing; rather, CCDs in accordance with embodiments of the invention have multiple (e.g., four) phases (i.e., multiple independently actuated control gates for the movement of charge within the CCD) and only one control gate per phase of the CCD. In various embodiments, all of the CCD gate electrodes span at least the entire width of the CCD channel therebelow, and may even extend beyond the lateral (i.e., perpendicular to the direction of charge flow) edges of the channel, thereby enabling the CCD to hold and manipulate as much charge as possible.

In an aspect, embodiments of the invention feature a charge-coupled device (CCD) including or consisting essentially of a channel for transfer of charge carriers therein, a plurality of gate electrodes for controlling transfer of charge carriers within the channel, first and second channel stops, and fully depleted regions. The channel has a first conductivity type and the first and second channel stops have a second conductivity type opposite the first conductivity type. The plurality of gate electrodes are disposed over the channel, and the first and second channel stops are laterally spaced away from opposite sides of the channel. A fully depleted region is disposed between the channel and each of the first and second channel stops.

Embodiments of the invention may include one or more of the following in any of a variety of combinations. At least one (e.g., both) of the fully depleted regions may extend beneath the channel. The CCD may transfer charge carriers in multiple phases, and the plurality of gate electrodes may include only one independently controllable gate electrode for each phase. At least one of the plurality of gate electrodes may be configured to multiply charge within the channel via application of a voltage larger than a voltage applied by at least one other gate electrode. The first and/or second channel stop may be a continuous doped region extending substantially along an entire length of the channel. The first and/or second channel stop may include or consist essentially of a plurality of discrete and separated doped regions. A plurality of control wires may each be electrically connected to a gate electrode. The horizontal distance between the channel and the second channel stop may be less than the horizontal distance between the channel and at least one of the control wires. The horizontal distance between the channel and the second channel stop may be greater than the horizontal distance between the channel and the control wire disposed farthest from the channel. The channel may be disposed within a doped well of the second conductivity type. Each of the gate electrodes may have a width larger than the width of the channel.

In another aspect, embodiments of the invention feature a method of forming a charge-coupled device (CCD). A channel having a first conductivity type is formed within a substrate. A plurality of gate electrodes for controlling transfer of charge carriers within the channel is formed over the channel. First and second channel stops having a second conductivity type opposite the first conductivity type are formed laterally spaced away from opposite sides of the channel. The first and second channel stops are each spaced away from the channel by a fully depleted region.

Embodiments of the invention may include one or more of the following in any of a variety of combinations. Forming the channel may include or consist essentially of ion implantation of dopants of the first conductivity type. Forming the first and second channel stops may include or consist essentially of ion implantation of dopants of the second conductivity type. At least one of the plurality of gate electrodes may be configured to multiply charge within the channel via application of a voltage larger than a voltage applied by at least one other gate electrode.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately" and "substantially" mean .+−0.10%, and in some embodiments, .+−0.5%. The term "consists essentially of means excluding other materials that contribute to function, unless otherwise defined herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 3A is a schematic cross-section along line B-B in FIG. 2;

FIGS. 3B and 3C are exemplary potential diagrams at different times during the operation of the portion of the image sensor depicted in FIG. 3A;

FIG. 4 is a schematic cross-section along line C-C in FIG. 2;

FIG. 9 is a schematic cross-section along line D-D in FIG. 8.

DETAILED DESCRIPTION

Figure 1:
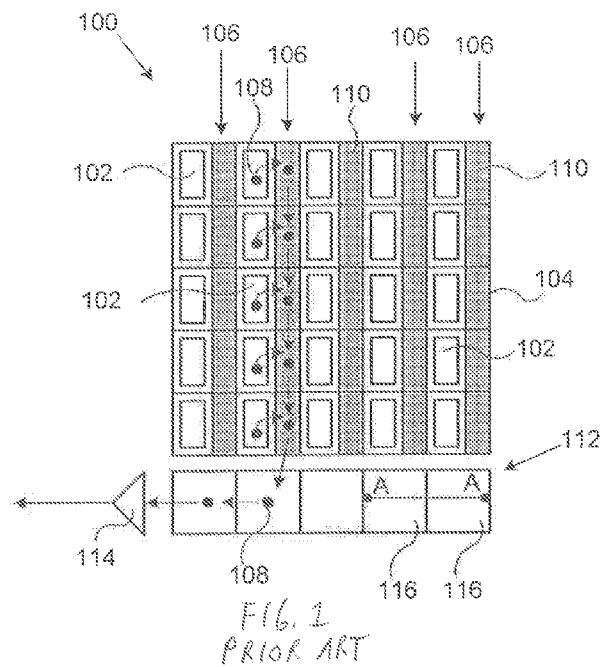
FIG. 1 is a block diagram of a conventional interline CCD image sensor.
Figure 2:
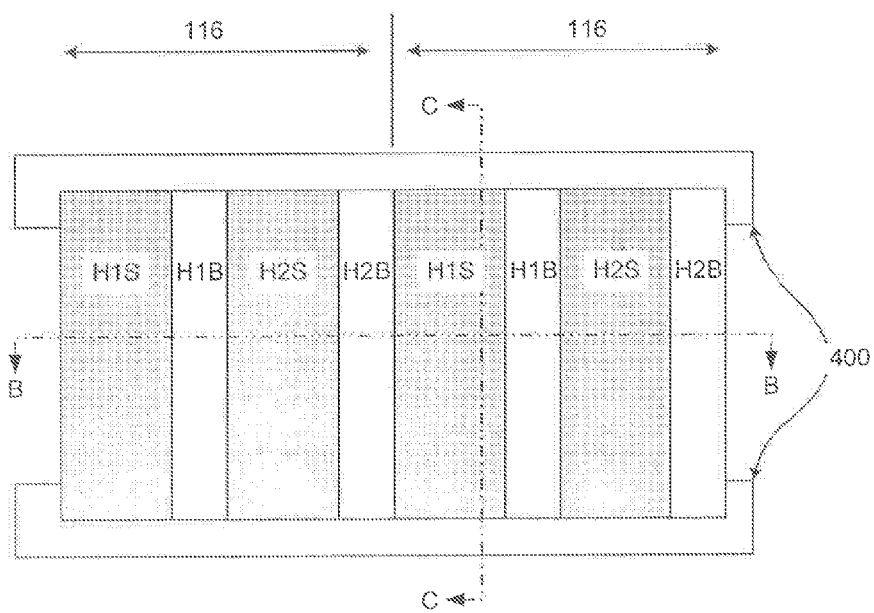
FIG. 2 is an expanded plan view of a portion of the image sensor along line A-A of FIG. 1.
Figure 5:
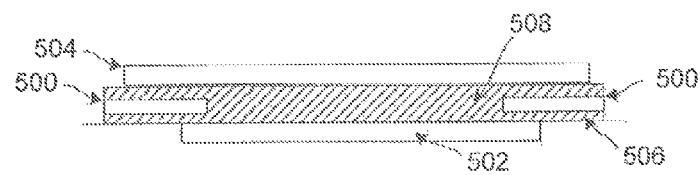
FIG. 5 is a schematic cross-section of a portion of a conventional charge-multiplying HCCD.
Figure 6:
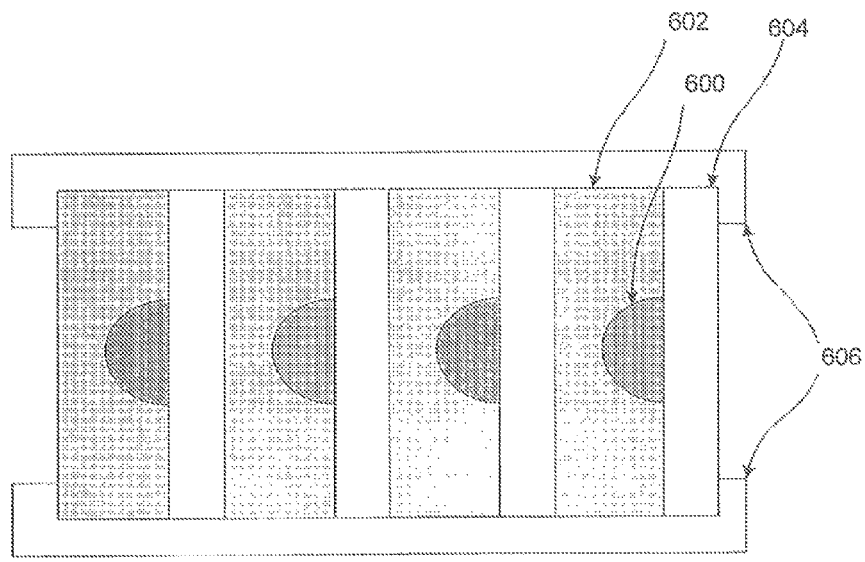
FIG. 6 is a schematic plan view of shift elements of a conventional charge-multiplying HCCD.
Figure 7:
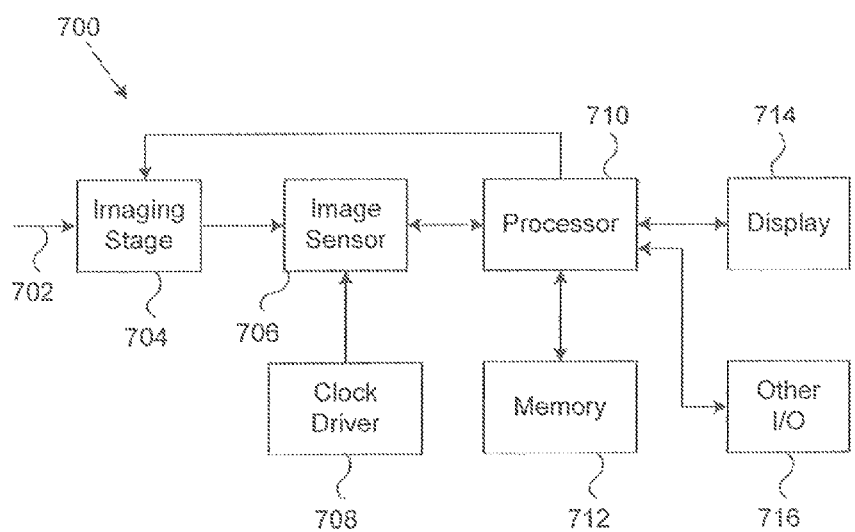
FIG. 7 is a block diagram of an image capture device in accordance with various embodiments of the invention.

FIG. 7 is a simplified block diagram of an image capture device 700 in accordance with various embodiments of the invention. Image capture device 700 is implemented as a digital camera in FIG. 7. Those skilled in the art will recognize that a digital camera is only one example of an image capture device that can utilize image sensors incorporating embodiments of the present invention. Other types of image capture devices, such as, for example, cell phone cameras and digital video camcorders, may also be utilized in accordance with embodiments of the invention.

In digital camera 700, light 702 from a subject scene is input to an imaging stage 704. Imaging stage 704 may include conventional elements such as a lens, a neutral density filter, an iris, and a shutter. Light 702 is focused by imaging stage 704 to form an image on image sensor 706. Image sensor 706 captures one or more images by converting the incident light into electrical signals. Image sensor 706 is implemented as a CCD image sensor. Clock driver 708 produces clock signals that are used by image sensor 706. With respect to various embodiments of the present invention, clock driver 708 produces clock signals that are used by image sensor 706 for reading out an image and for one or more charge-multiplying operations.

Digital camera 700 further includes processor 710, memory 712, display 714, and one or more additional input/output (I/O) elements 716. Although shown as separate elements in the embodiment of FIG. 7, imaging stage 704 may be integrated with image sensor 706, and possibly one or more additional elements of digital camera 700, to form a compact camera module.

Processor 710 may be implemented, for example, as a microprocessor, a central processing unit (CPU), an application-specific integrated circuit (ASIC), a digital signal processor (DSP), or other processing device, or combinations of multiple such devices. Various elements of imaging stage 704 and image sensor 706 may be controlled by timing signals or other signals supplied from processor 710. The function of clock driver 708 is performed by processor 710 in some embodiments in accordance with the invention. In other embodiments in accordance with the invention, clock driver 708 or a processor performing the function of clock driver 708 are integrated with image sensor 706.

Memory 712 may include or consist essentially of any type of memory, such as, for example, random access memory (RAM), read-only memory (ROM), Flash memory, disk-based memory, removable memory, or other types of storage elements, in any combination. A given image captured by image sensor 706 may be stored by processor 710 in memory 712 and presented on a display 714. Additionally, the function of clock driver 708 is performed by memory 712 and processor 710 in another embodiment in accordance with the invention. The clock signals for the charge-multiplying operation may be stored in memory 712 and read out by processor 710. Memory 712, processor 710, or both memory 712 and processor 710 may be integrated with image sensor 706 in embodiments in accordance with the invention.

Display 714 is typically an active matrix color liquid crystal display (LCD), although other types of displays may be used. The additional I/O elements 716 may include, for example, various on-screen controls, buttons or other user interfaces, network interfaces, or memory card interfaces.

It is to be appreciated that the digital camera shown in FIG. 7 may feature additional or alternative elements known to those skilled in the art. Elements not specifically shown or described herein may be selected from those known in the art. As noted previously, embodiments of the present invention may be implemented in a wide variety of image capture devices. Also, certain aspects of the embodiments described herein may be implemented at least in part in the form of software executed by one or more processing elements of an image capture device. Such software may be implemented in a straightforward manner given the teachings provided herein, as will be appreciated by those skilled in the art.

Figure 8:
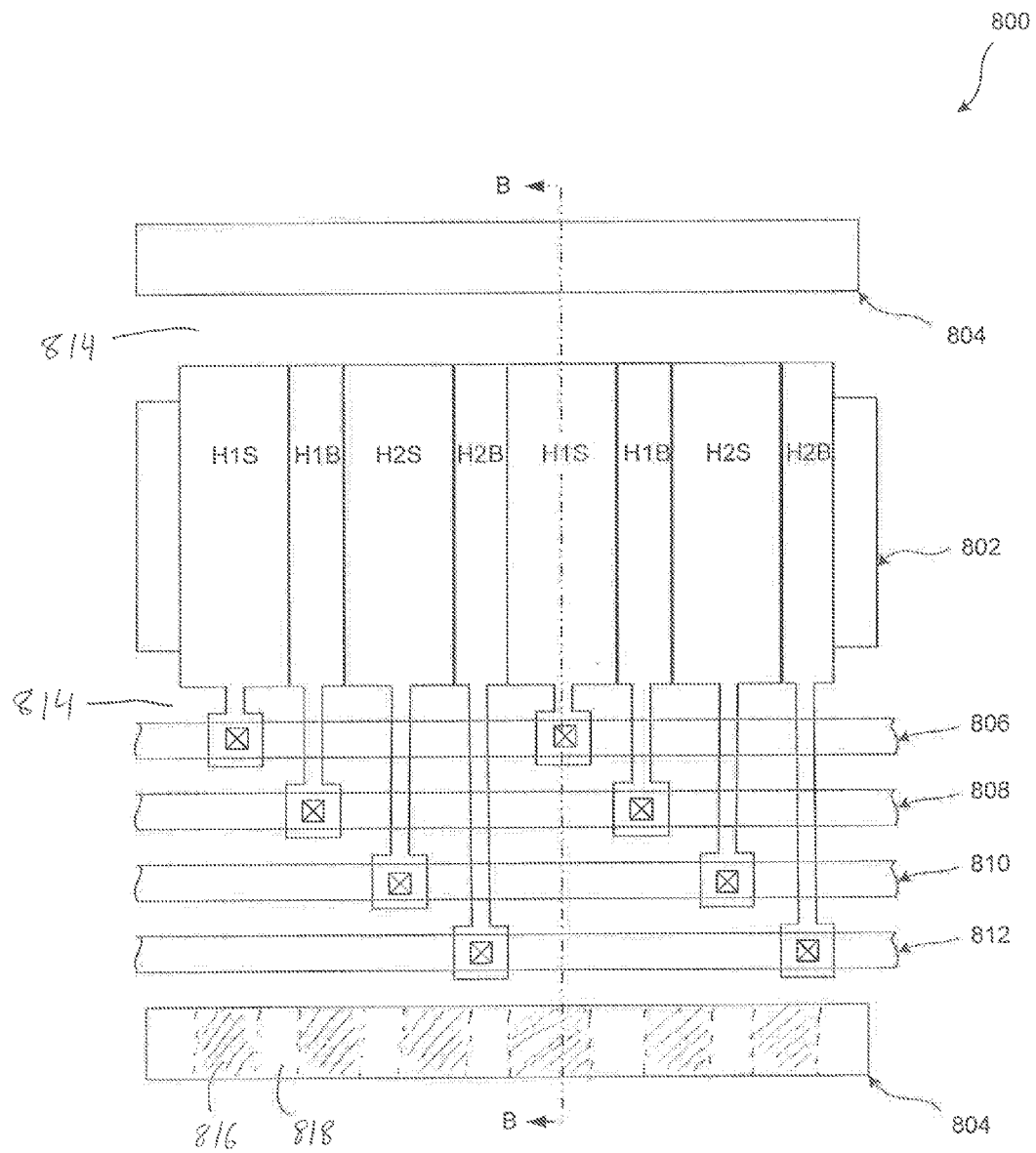
FIG. 8 is a schematic plan view of a charge-multiplying HCCD in accordance with various embodiments of the invention.

Referring now to FIG. 8, a CCD 800 in accordance with an embodiment of the present invention includes gate electrodes H1S, H1B, H2S, and H2B disposed over a buried channel 802 (which in an embodiment is doped n-type). The H1S and H2S gate electrodes are high-voltage charge-multiplying electrodes in an embodiment in accordance with the invention. The channel 802 may be formed via, e.g., ion implantation. The heavily doped channel stops 804 (which are p-type for an n-type buried channel 802) are spaced away from the CCD gate electrodes and preferably also spaced away from wires 806, 808, 810, 812 that conduct the controlling clocking signals to the CCD gate electrodes. In the illustrated embodiment, all wires and gate electrodes that may carry a high voltage are disposed at a distance from channel stops 804 sufficient to prevent the channel stops from generating spurious charge. The channel stops 804 themselves do not directly confine charge within the CCD 800; rather, the buried channel 802 confines such charge within the CCD 800. Furthermore, neither the CCD gate electrodes H1S, H1B, H2S, and H2B, nor any other gate electrodes, are disposed directly over the channel stops 804. The lateral distance between the channel stops 804 and the channel 802 may be approximately 1 .mu.m or greater, in order to substantially prevent generation of spurious charge within the channel 802.

As shown in FIG. 8, the channel stops 804 are spaced away from the channel 802 by charge-depleted regions 814, which are fully depleted of charge carriers, at least during operation of CCD 800. As utilized herein, "fully depleted" means substantially free of charge carriers (holes in the above exemplary embodiment) and/or including or consisting essentially of an electrically insulating material (e.g., a dielectric), at least during typical operation. A fully depleted region may have a relatively low doping level (and thus low level of charge carriers) when not in operation, but such carriers are easily removed from the region via, e.g., application of a moderate voltage. Since charge-depleted regions 814 are fully depleted, spurious charge generation via impact ionization at the interfaces of channel 802 therewith is substantially eliminated. The fully depleted regions may also extend below the channel 802. The channel stops 804 may be formed via, e.g., ion implantation. As utilized herein, a "channel stop" is a region doped with a conductivity type opposite that of the channel and that is not fully depleted. For example, a channel stop may include or consist essentially of a well-defined region containing implanted dopants or a portion of a doped, non-depleted well having a conductivity type opposite that of the channel (e.g., a non-depleted p-well). In accordance with embodiments of the invention, channel stops may also be utilized as voltage references for the ground voltage (e.g., 0 V GND) against which other operating voltages are measured and defined.

FIG. 9 is a cross-sectional view along line B-B in FIG. 8. The p-type channel stops 804 and the n-type CCD buried channel 802 are disposed in a p-type well 900, which is formed over an n-type substrate 902. The p-type well 900 doping level is sufficiently low such that well 900 (at least charge-depleted regions 814 thereof) is fully depleted, at least when well 900 is held at 0 V and a positive voltage is applied to the n-type substrate 902. As mentioned above, the lack of charge carriers (holes in this example) substantially eliminates spurious charge generation in the CCD channel 802 when high voltages are applied to gate H1S. The charge in the CCD channel 802 is confined under the gate H1S by the n-type doping of the CCD channel 802, i.e., the channel 802 is defined by the doping therein. In preferred embodiments of the invention, the channel stops 804 are not in contact with the n-type CCD channel 802.

In an embodiment of the invention, the wiring is arranged such that wires 806 and 808 carry the high-voltage signals (e.g., clock amplitudes greater than approximately 13 V) and wires 810 and 812 carry low-voltage signals lower than the high-voltage signals (e.g., clock amplitudes less than approximately 10 V). In an embodiment, the low-voltage signals are insufficient to generate spurious charge via impact ionization, and thus a channel stop 804 may be disposed underneath the wires 810 and/or 812. In various embodiments of the invention, the channel stops 804 are not continuous doped regions; rather, the channel stops may be formed as multiple doped islands 816 separated by undoped or fully depleted regions 818, as illustrated for the lower channel stop 804 in FIG. 8.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

The invention claimed is:

1. A charge-coupled device (CCD) comprising:
    a channel for transfer of charge carriers therein, the channel having a first conductivity type;
    disposed over the channel, a plurality of gate electrodes for controlling transfer of charge carriers within the channel;
    first and second fully depleted regions at first and second sides of the channel; and
    laterally spaced away from opposite sides of the gate electrodes and separated from the gate electrodes by the first and second depleted regions, first and second channel stops having a second conductivity type opposite the first conductivity type.

2. The CCD of claim 1, wherein at least one of the fully depleted regions extends beneath the channel.

3. The CCD of claim 1, wherein (i) the CCD transfers charge carriers in multiple phases, and (ii) the plurality of gate electrodes comprises only one independently controllable gate electrode for each phase.

4. The CCD of claim 1, wherein the CCD configures at least one of the plurality of gate electrodes to multiply charge within the channel via application of a voltage larger than a voltage applied by at least one other gate electrode.

5. The CCD of claim 1, wherein at least one of the first or second channel stops is a continuous doped region extending substantially along an entire length of the channel.

6. The CCD of claim 1, wherein at least one of the first or second channel stops comprises a plurality of discrete and separated doped regions.

7. The CCD of claim 1, further comprising a plurality of control wires each electrically connected to a gate electrode, wherein a lateral distance between the channel and the second channel stop is less than a lateral distance between the channel and at least one of the control wires.

8. The CCD of claim 1, further comprising a plurality of control wires each electrically connected to a gate electrode, wherein a lateral distance between the channel and the second channel stop is greater than a lateral distance between the channel and the control wire disposed farthest from the channel.

9. The CCD of claim 1, wherein the channel is disposed within a doped well of the second conductivity type.

10. The CCD of claim 1, wherein each of the plurality of gate electrodes has a width larger than a width of the channel.

11. The CCD of claim 1, wherein the fully depleted region is of the second conductivity type.

12. A method of forming a charge-coupled device (CCD), the method comprising:
    forming a channel disposed within a substrate, the channel having a first conductivity type;
    forming, over the channel, a plurality of gate electrodes for controlling transfer of charge carriers within the channel;
    forming, at first and second sides of the channel, first and second fully depleted regions; and
    forming, laterally spaced away from opposite sides of the gate electrodes and separated from the gate electrodes by the first and second depleted regions, first and second channel stops having a second conductivity type opposite the first conductivity type,
    wherein the first and second channel stops are each spaced away from the channel by the first and second fully depleted regions, respectively.

13. The method of claim 12, wherein forming the channel comprises ion implantation of dopants of the first conductivity type.

14. The method of claim 12, wherein forming the first and second channel stops comprises ion implantation of dopants of the second conductivity type.

15. The method of claim 12, further comprising multiplying charge within the channel via application of a voltage larger than a voltage applied by at least one other gate electrode.

16. The method of claim 12, wherein the fully depleted region is of the second conductivity type.

* * * * *